(12) United States Patent
Verheyen et al.

(10) Patent No.: US 7,799,664 B2
(45) Date of Patent: Sep. 21, 2010

(54) METHOD FOR SELECTIVE EPITAXIAL GROWTH OF SOURCE/DRAIN AREAS

(75) Inventors: Peter Verheyen, Nijlen (BE); Rita Rooyackers, Kessel-lo (BE); Denis Shamiryan, Leuven (BE)

(73) Assignee: IMEC, Leuven (BE)

( * ) Notice: Subject to any disclaimer, the term of this patent is extended or adjusted under 35 U.S.C. 154(b) by 610 days.

(21) Appl. No.: 11/645,149

(22) Filed: Dec. 22, 2006

(65) Prior Publication Data
US 2007/0148860 A1    Jun. 28, 2007

(30) Foreign Application Priority Data
Dec. 23, 2005    (EP) .................................. 05447290

(51) Int. Cl.
*H01L 29/225* (2006.01)
(52) U.S. Cl. ........................ 438/478; 438/924; 438/740; 438/738; 257/E21.246
(58) Field of Classification Search .......... 257/E21.246; 438/924, 740, 738
See application file for complete search history.

(56) References Cited

U.S. PATENT DOCUMENTS 6,872,610 B1 *   3/2005   Mansoori et al. ............ 438/197
7,288,802 B2 *  10/2007   Anderson et al. ............ 257/192
2003/0176033 A1 *  9/2003   Grider et al. ................. 438/231
2003/0219938 A1 * 11/2003   Rhee et al. .................... 438/199
2006/0003235 A1 *  1/2006   Sugimoto ......................... 430/5

FOREIGN PATENT DOCUMENTS

JP            04030518    *   2/1992

OTHER PUBLICATIONS

Stanford Nanotechnology Fabrication—Poly Silicon Plasma Etching—Aug. 29, 2003.*
Reference provided in previous communication with the applicant. Polysilicon Plasma Etching, Stanford Nanofabrication Facility, Aug. 29, 2003.*

* cited by examiner

*Primary Examiner*—Thanh V Pham
*Assistant Examiner*—Mohammad Choudhry
(74) *Attorney, Agent, or Firm*—Knobbe Martens Olson & Bear LLP

(57) ABSTRACT

One inventive aspect relates to a method of selective epitaxial growth of source/drain (S/D) areas. The method includes providing a substrate having a first and a second substrate area, the first area including at least one gate stack. The method includes applying a poly-Si or poly-SiGe top layer on the substrate, the top layer being etchable with the same etch chemistry as the substrate. The method includes removing the poly-Si or poly-SiGe top layer from the first area selectively towards the poly-Si or poly-SiGe top layer in the second area. The method includes removing simultaneously the poly-Si or poly-SiGe top layer on the second area and at least a part of the substrate in the S/D areas of the first area selectively to the gate stack. The method includes performing a selective epitaxial growth of S/D areas in the first area.

11 Claims, 2 Drawing Sheets

Figure 2: current invention

METHOD FOR SELECTIVE EPITAXIAL GROWTH OF SOURCE/DRAIN AREAS

BACKGROUND OF THE INVENTION

1. Field of the Invention

The present invention relates to a method for the selective growth of an epitaxial layer on source/drain areas.

2. Description of the Related Technology

In semiconductor fabrication a hard mask (HM) is applied in order to protect part of the wafer from etching the other part of the wafer. The hardmask usually has to be removed afterwards. Typically an etch resistant material is employed for the hardmask.

When considering a process flow for fabricating a CMOS FET transistor, a gate stack is formed, which is capped with a silicon oxide (2) and with spacers (4)(see FIG. 1(A)). Spacers (4) around the gate are typically in Si nitride. The full encapsulation is of vital importance, as it protects the gate during epitaxial growth. Further processing steps are depicted in FIG. 1. In a first step either a single layer hardmask (5) is deposited (FIG. 1(B.1)) or a hardmask stack, which cannot be etched during source/drain etching (in FIG. 1(B.2) a two-layer stack (5, 6) is shown). Next a first area is opened up comprising a source and drain (S/D) and a gate stack (FIG. 1(C)). The hardmask (5) is etched selectively towards Si oxide (used to cap the gate) and Si nitride (used for the spacers) of the first area and also selectively to the hardmask on top of a second area of the substrate (1). If the hardmask etching is not performed in a sufficiently selective way, an accurate control of the lost amount of Si oxide/Si nitride is required. In the following step (FIG. 1(D)) a source/drain (S/D) silicon etch is performed selectively towards Si oxide and Si nitride. The etch rate depends on the amount of exposed Si. A part of the hardmask (5) is consumed by a break through (BT) etch. Next an epitaxial layer is grown. During the epitaxial growth a selective growth towards the hardmask in the second area is required. The epitaxial growth is only selective towards Si oxide and Si nitride. Finally the hardmask is removed on the second area (FIG. 1(E)). Note that the hardmask cannot be removed before the epitaxial layer has grown as it should protect (at least the second area on) the wafer. In the state of the art approach the hardmask on the second area is removed afterwards by an etching step, which causes field oxide loss. A possible solution exists in providing an additional protective mask on the first area, which clearly would increase the complexity.

Silicon nitride is the typical material for spacers (4). Si nitride cannot be applied for the hardmask (5), as during hardmask removal it would remove the spacers (4) as well. An alternative would be the use of Si oxide. However, Si oxide is not an appropriate material either, as Si oxide may be used on top of the gate. When using a Si oxide hardmask, one would have to remove the hardmask very carefully in order not to damage the oxide capping layer on top of the gate (in order to protect the gate during the epitaxial growth). Using a Si oxide hardmask, the extra oxide on top of the second area must be removed, which increases field loss on the first area, as the latter 'sees' the double removal of the oxide layer. An option would be to use lithography and etch only on the second area, which increases complexity.

In the state of the art solutions it is neither possible to use poly-silicon as the hardmask material. The poly-Si hardmask would have to be removed before the epitaxial growth, as it does not allow such epitaxial growth in a selective way. The epitaxial layer will cover the whole wafer and not only fill the S/D areas of the first area. However, it would be desirable and advantageous to have a poly-Si hardmask, as it would allow etching selectively towards nitride and oxide (e.g. towards an oxide gate capping layer or towards the field oxide), which would put less strain.

It is thus desirable to provide a method for selective epitaxial growth of S/D areas that overcomes the drawbacks of the prior art solutions.

SUMMARY OF CERTAIN INVENTIVE ASPECTS

Certain inventive aspects relate to a method for selective epitaxial growth of source/drain areas. It comprises an initial step of providing a substrate of semiconductor material, the substrate consisting of a first substrate area and a second substrate area. The first area comprises at least one gate stack. The method further comprises the steps of:

applying at least a poly-Si top layer on the substrate, the top layer being etchable with a given etch chemistry, removing the poly-Si top layer from the first area of the substrate selectively towards the poly-Si top layer in the second substrate area, removing simultaneously the poly-Si top layer on the second substrate area and at least a part of the substrate in the first substrate area with the given solution, performing a selective epitaxial growth of S/D areas in the first substrate area.

In a preferred embodiment a second layer is applied between the poly-Si top layer and the substrate, which is not etchable with the given etch chemistry.

Advantageously the step of removing the poly-Si top layer from the first area is performed until a spacer liner, a spacer material or the second layer is exposed.

In a specific embodiment the step of simultaneously removing comprises a breakthrough etch step for removing the spacer liner or the second layer.

Between the step of removing the poly-Si top layer from the first area and the step of simultaneously removing preferably a step is performed of removing resist on top of the second area.

In another embodiment the second area comprises at least one gate stack.

In another advantageous embodiment the method further comprises a step of end-point triggering.

The substrate is preferably of silicon, germanium, SiGe or any other suitable semiconductor material.

The given etch chemistry is preferably of a mixture of SF6 and HBr. Any other etch chemistry suitable for etching S/D areas selectively towards Si oxide and Si nitride may also be used.

The second layer is preferably of oxide. Optionally it may be of nitride.

DETAILED DESCRIPTION OF CERTAIN ILLUSTRATIVE EMBODIMENTS

Figure 1A:
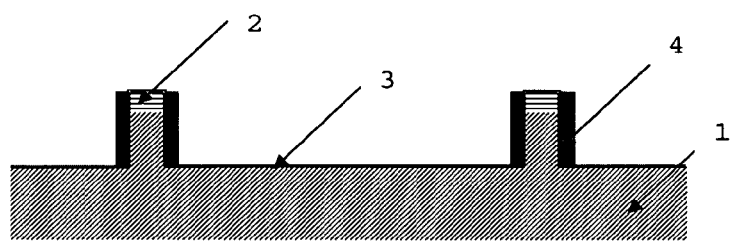
FIG. 1 represents the method steps of the prior art solution.
Figure 1C:
Figure 1C:
Figure 1C:
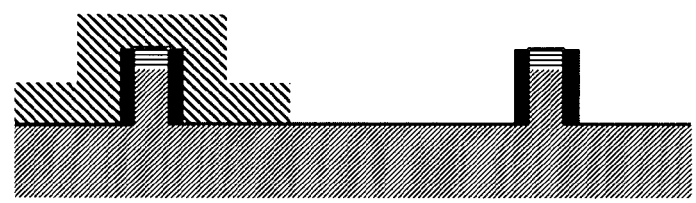
Figure 1D:
Figure 1E:
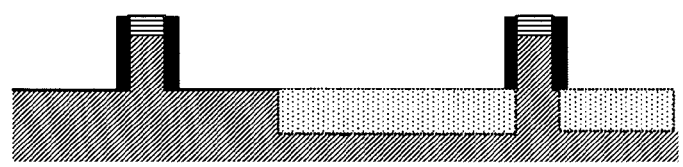
Figure 2A:
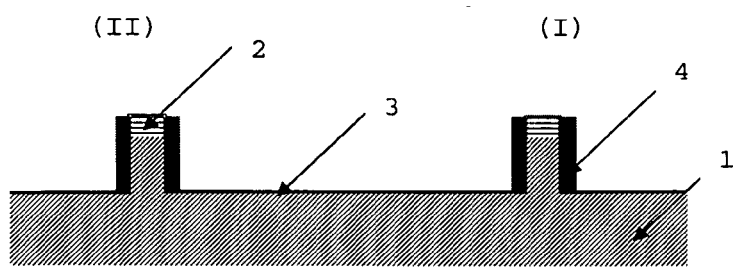
FIG. 2 represents the method steps of the solution according to one embodiment.

The method according to certain embodiments combines a selective epitaxial growth of S/D areas with the advantageous use of a hardmask etchable with the same etch chemistry as the S/D material to be etched. A preferable example is a poly-Si hardmask. Optionally it is (poly-) SiGe. Typically, a gate stack is fully encapsulated after spacer processing (FIG. 2(A)). Then the different steps of the method are performed as presented in FIG. 2 (B)-2(E).

First a poly-Si or a poly-SiGe hardmask layer (FIG. 2(B.1)) or a hardmask layer stack (FIG. 2(B.2)) comprising at least a poly-Si or poly-SiGe top layer (5) and e.g. a further layer of oxide (6) is deposited. The hardmask (5) top layer must be such that it is selectively etchable towards Si oxide (e.g. on top of the gate) and Si nitride. The top layer (5) is thus etchable with a chemistry that does not etch e.g. the Si oxide (2) on top of the gate. When using a poly-Si or poly-SiGe hardmask approach, it is possible to etch the poly-Si or poly-SiGe selectively to Si oxide and Si nitride. This way less strain is put on the oxide on top of the gate.

Figure 2C:
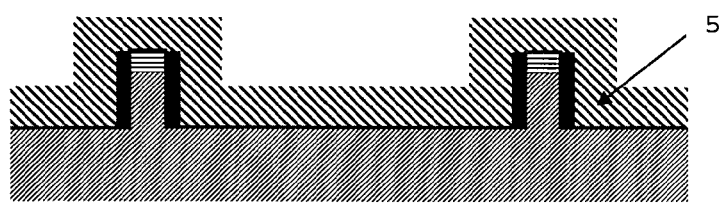
Figure 2C:
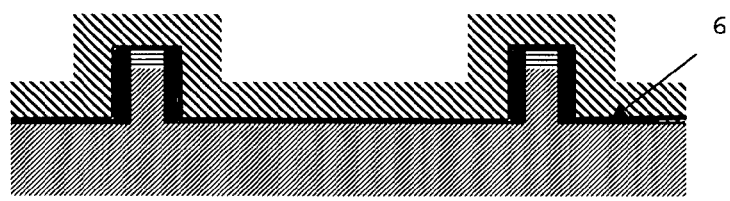
Figure 2C:
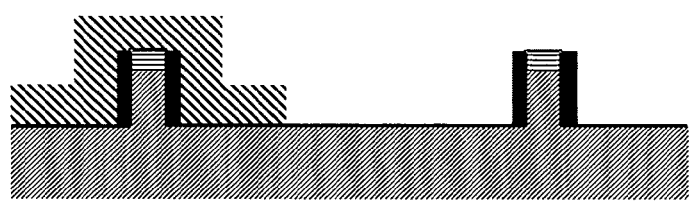

In a next step (FIG. 2(C)) a first area (I) on the substrate is opened up by removing the top layer, stopping on the spacer material and spacer liner (3) (or on an extra deposited material (6) in case of a masking material stack). The top layer (5) on the second area (II) remains unchanged at this stage.

In an intermediate step the resist on top of the second area is removed by means of a resist strip.

Figure 2D:
Figure 2E:

In a subsequent step (FIG. 2(D)) the poly-Si or poly-SiGe top layer (5) on the second area as well as a part of the substrate in the first area are etched with the given solution. This step may comprise the application of a breakthrough (BT) etch step, wherein the remaining spacer liner (3) or a stop layer in extra deposited material (6) is removed. Both the remaining spacer liner (3) and the extra deposited material (6) may function as a stop layer. The BT etch step will etch through the oxide stop layer (3,6), typically for a few seconds clearing out the stop layer prior to the next step. As the poly-Si or poly-SiGe hardmask (5) is consumed during this process step, the overall etch rate could decrease and as such the etch depth control would be improved.

During the poly-Si or poly-SiGe hardmask removal, an end-point triggering can be performed, which was not possible in the prior art solutions, where no poly-Si or poly-SiGe hardmask was used. The end-point is defined as the time instant during an etching operation when etching of material is completed. Continuing the etching beyond the end-point would result in overetching. In our case the end point is reached when the transition from the poly-Si or poly-SiGe (5) to Si oxide (3,6) is detected, as shown in FIG. 2 (E). This transition may simultaneously be used as end-point detection for the S/D material etching. The exposed Si oxide (either the spacer liner (3) or the extra oxide which was deposited (6)) has to sustain the pre-epi clean before epitaxial growth. The etch rate of the hardmask material can be chosen to be the same/higher/lower in order to get an etch depth, which would be the same/lower/higher than the etch depth of the S/D material.

The method according to certain embodiments allows a better control of the etch rate (less pattern dependent for the recess etch in a S/D module). Further the thickness of the layer (3,6) to which the etch is selective can be reduced, since it doesn't have to withstand the BT etch. The consumption of the field oxide can be in this way limited. As a further advantage opening up the HM on the first area can be more gentle on the Si oxide on top of the gate stack in the first area, which could reduce the thickness of the oxide needed on the gate.

In one embodiment the thickness of the poly-Si or poly-SiGe hardmask layer (5) may be approximately between 20-150 nm, preferably about 70 nm.

In another embodiment the Ge concentration of the poly-SiGe hardmask layer (5) may be approximately between 0% to 0.5%, preferably about 0%. In the case wet etch is used to remove the remaining poly-SiGe the preferred Ge concentration is about 0.5%.

In yet another embodiment the thickness of the extra oxide layer (6) underneath the poly-Si or poly-SiGe hardmask (5) may be approximately between 0-30 nm, preferably about 10 nm. The thickness of the oxide layer may be correlated with the clean before the epitaxial growth.

In a preferred embodiment the thickness of the poly-Si or poly-SiGe hardmask layer (5) may be approximately between 20-150 nm, preferably about 70 nm. Underneath the poly-Si or poly-SiGe hardmask an extra oxide layer (6) with the thickness approximately between 0-30 nm, preferably about 10 nm may be deposited. The Ge concentration of the poly-SiGe hardmask layer (5) may be approximately between 0% to 0.5%, preferably about 0%.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of performing selective epitaxial growth of source/drain (S/D) areas, comprising:
   providing a substrate of a semiconductor material, the substrate comprising a first substrate area and a second substrate area, the first area comprising at least one gate stack;
   applying at least a poly-Si or poly-SiGe top layer on the substrate, the top layer being etchable with the same etch chemistry as the substrate;
   removing the poly-Si or poly-SiGe top layer from the first area of the substrate selectively towards the poly-Si or poly-SiGe top layer in the second substrate area;
   removing simultaneously the poly-Si or poly-SiGe top layer on the second substrate area and at least a part of the substrate in the S/D areas of the first substrate area selectively toward the at least one gate stack; and
   performing a selective epitaxial growth of S/D areas in the first substrate area.
   Wherein between the poly-Si or poly-SiGe top layer and the substrate a stop layer is applied, which is not etchable with the same etch chemistry as the top layer;
   wherein the removing of the poly-Si or poly-SiGe top layer from the first area is performed until the stop layer is exposed;
   wherein the simultaneously removing comprises a breakthrough etch process for removing the stop layer.

2. The method of claim 1, further comprising depositing and patterning a resist layer on top of the poly-Si or poly-SiGe top layer in order to mask the second area and expose the first area.

3. The method of claim 2, further comprising removing resist on top of the second area, between the process of removing the poly-Si or poly-SiGe top layer from the first area and the process of simultaneously removing.

4. The method of claim 1, wherein the second area comprises at least one gate stack.

5. The method of claim 1, further comprising end-point triggering.

6. The method of claim 1, wherein the substrate is formed of silicon, germanium or SiGe.

7. The method of claim 1, wherein the substrate and the poly-Si top layer are etched with a mixture of SF6 and HBr.

8. The method of claim 1, wherein the poly-Si or poly-SiGe top layer has a thickness approximately between 20-150 nm.

9. The method of claim 1, wherein the poly-SiGe top layer has a Ge concentration approximately between 0% to 0.5%.

10. The method of claim 1, wherein the stop layer is formed of Si oxide.

11. The method of claim 10, wherein the Si oxide stop layer has a thickness approximately between 0-30 nm.

* * * * *